(12) United States Patent
Fujioka et al.

(10) Patent No.: US 10,573,706 B2
(45) Date of Patent: Feb. 25, 2020

(54) DISPLAY DEVICE

(71) Applicant: Japan Display Inc., Minato-ku (JP)

(72) Inventors: Takahiro Fujioka, Minato-ku (JP); Masumi Nishimura, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 13 days.

(21) Appl. No.: 15/890,728

(22) Filed: Feb. 7, 2018

(65) Prior Publication Data
US 2018/0247993 A1    Aug. 30, 2018

(30) Foreign Application Priority Data
Feb. 24, 2017    (JP) .................... 2017-033020

(51) Int. Cl.
*H01L 27/32*    (2006.01)
*H01L 27/12*    (2006.01)

(52) U.S. Cl.
CPC ...... *H01L 27/3276* (2013.01); *H01L 27/1244* (2013.01); *G09G 2310/0264* (2013.01)

(58) Field of Classification Search
CPC .............. H01L 27/3276; H01L 27/12; G09G 2310/0264

USPC ........................................................ 345/76
See application file for complete search history.

(56) References Cited

U.S. PATENT DOCUMENTS

| 2016/0172428 A1* | 6/2016 | Song | H01L 27/3276 |
| | | | 257/99 |
| 2017/0110529 A1* | 4/2017 | Zhang | H01L 27/3276 |

* cited by examiner

*Primary Examiner* — Amare Mengistu
*Assistant Examiner* — Gloryvid Figueroa-Gibson
(74) *Attorney, Agent, or Firm* — Oblon, McClelland, Maier & Neustadt, L.L.P.

(57) ABSTRACT

A first bent wiring has a first bent portion which is positioned between first and second extending portions and is bent to a side of a first direction. A second bent portion is positioned between the second extending portion and a third extending portion and is bent to a second direction side. A second bent wiring has a third bent portion which is positioned on the second direction side when viewed from the first bent wiring and between fourth and fifth extending portions and is bent to the side of the first direction and a fourth bent portion which is positioned between the fifth extending portion and a sixth extending portion and is bent to the second direction side. A bending point of the third bent portion is positioned on the side of the first direction when viewed from a bending point of the second bent portion.

16 Claims, 12 Drawing Sheets

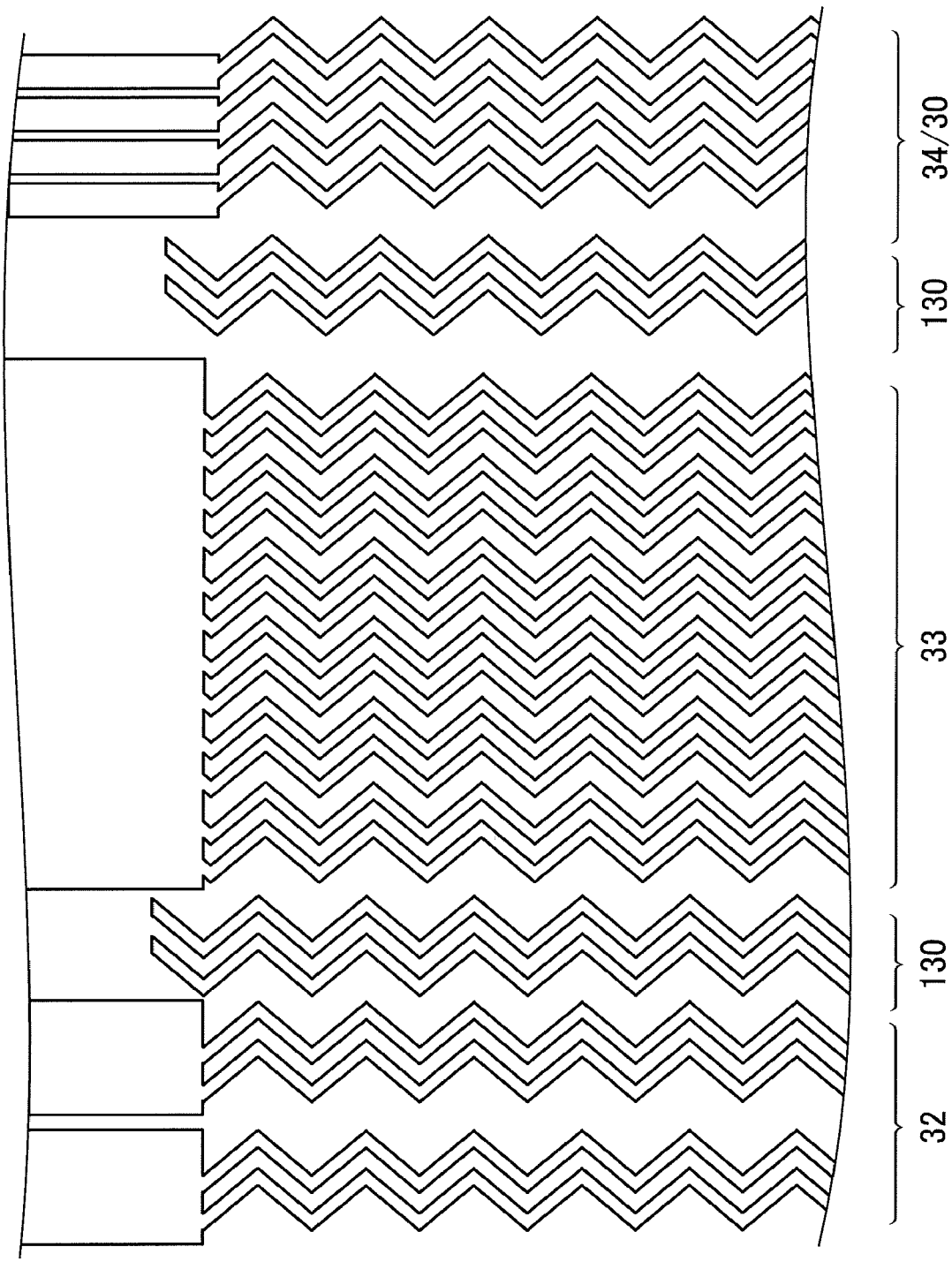

DISPLAY DEVICE

CROSS-REFERENCE TO RELATED APPLICATION

The present application claims priority from Japanese application JP2017-033020 filed on Feb. 24, 2017, the content of which is hereby incorporated by reference into this application.

BACKGROUND OF THE INVENTION

1. Field of the Invention

One or more embodiments of the present invention relate to a display device.

2. Description of the Related Art

A flat panel display such as an organic electroluminescence (EL) display device has a display panel where a thin film transistor (TFT), an organic light-emitting diode (OLED), and the like are formed on a substrate. As a base material of the display panel, conventionally, a glass substrate was used, but in recent years, a development of a flexible display whose display panel can be bent by using a resin film or the like such as a polyimide film as this base material is proceeded.

As a purpose of the flexible display, obtaining a narrow frame by folding a mounting area of an integrated circuit (IC) and a flexible printed circuit (FPC) that are arranged outside the image display area of the display panel to the backside of the display area is considered.

Patent document 1 as below (U.S. Unexamined Patent Application Publication No. 2016/0172428) discloses a wiring whose form is a combination of rhombi as a wiring provided on a bent area formed by folding the mounting area to the backside of the display area.

SUMMARY OF THE INVENTION

However, the conventional configuration as above is not a configuration that realizes a low resistance of the wiring provided on the bent area. That is, in a case where the wiring is used whose form is the combination of rhombi as above, a ratio of conductive body formation area with respect to a unit area is small, and therefore a low resistance of the wiring could not have been realized.

The present disclosure has been made in view of the problem as above, and the object thereof is to realize a low resistance of the wiring in the bent area.

A display device according to the present disclosure includes a display area which has a pixel array part, a driving part formation area which is provided on a backside of the display area and has a driving part to drive the pixel array part, and a bent area which connects the display area and the driving part formation area, and has a first wiring to electrically connect the pixel array part and the driving part. The first wiring has a first bent wiring and a second bent wiring, and the first bent wiring includes a first extending portion which extends in a direction having a direction component of an extending direction of the first wiring and a direction component of a first direction roughly orthogonal to the extending direction of the first wiring, a second extending portion which extends in a direction having a direction component of the extending direction of the first wiring and a direction component of a second direction roughly opposite to the first direction, a third extending portion which extends in a direction having a direction component of the extending direction of the first wiring and a direction component of the first direction, a first bent portion which is positioned between the first extending portion and the second extending portion and is bent to a side of the first direction, and a second bent portion which is positioned between the second extending portion and the third extending portion and is bent to a side of the second direction. The second bent wiring is positioned on the side of the second direction when viewed from the first wiring, and includes a fourth extending portion which extends in a direction having a direction component of the extending direction of the first wiring and a direction component of the first direction, a fifth extending portion which extends in a direction having a direction component of the extending direction of the first wiring and a direction component of the second direction, a sixth extending portion which extends in a direction having a direction component of the extending direction of the first wiring and a direction component of the first direction, a third bent portion which is positioned between the fourth extending portion and the fifth extending portion and is bent to the side of the first direction, and a fourth bent portion which is positioned between the fifth extending portion and the sixth extending portion and is bent to the side of the second direction. A bending point of the third bent portion is positioned on the side of the first direction when viewed from a bending point of the second bent portion.

BRIEF DESCRIPTION OF THE DRAWINGS

FIG. 12 illustrates a schematic view of various kinds of wirings formed in the bent area according to the present invention.

DETAILED DESCRIPTION OF THE INVENTION

First Embodiment

Figure 1:
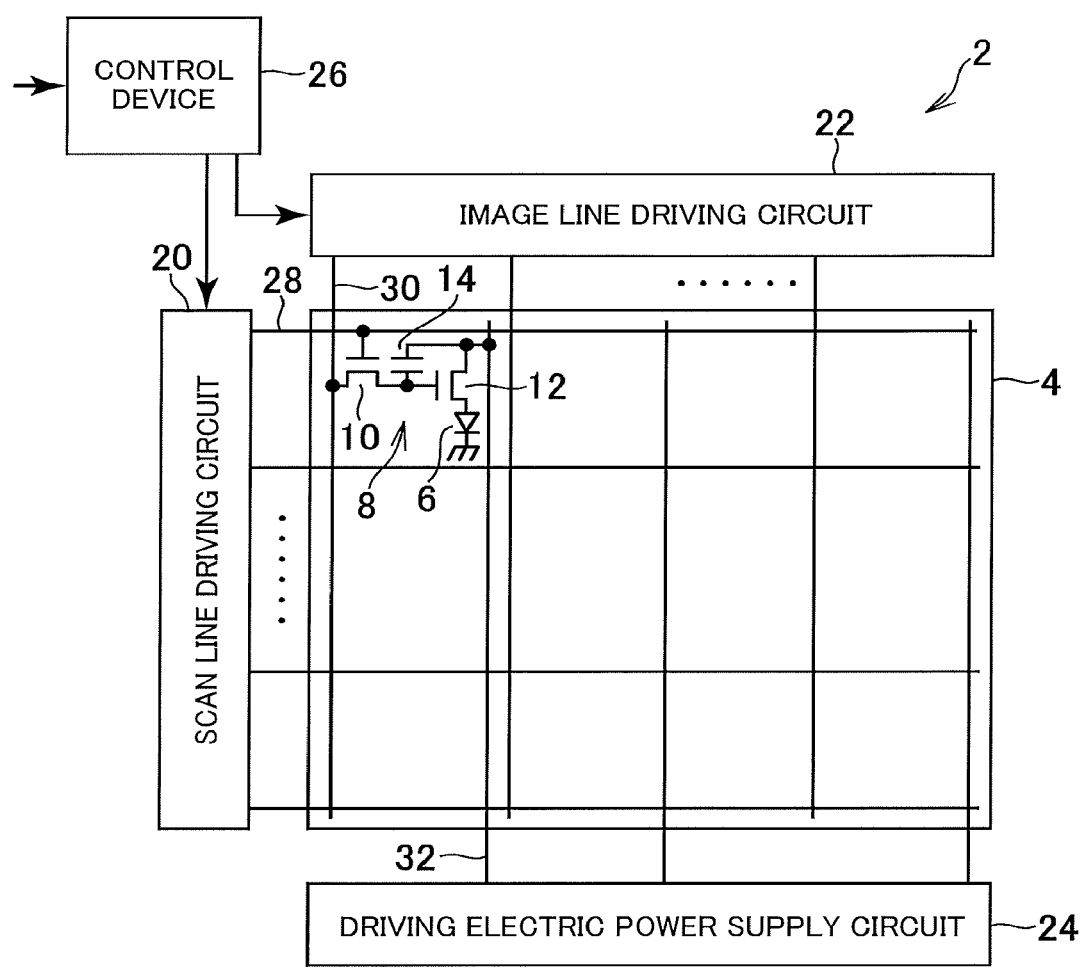
FIG. 1 illustrates a schematic view of a configuration of a display device according to the present invention.

Below, the one or more embodiments of the present disclosure are explained with reference to the accompanying drawings.

Note that the present disclosure is merely an example, and an appropriate variation that a person skilled in the art can easily arrive at without departing from the spirit of the present invention is naturally included in the scope of the present invention. Further, while the width, thickness, shape, and the like of each part in the drawings may be illustrated schematically as compared with the actual embodiments in order to clarify the explanation, these are merely examples, and an interpretation of the present invention should not be limited thereto. Furthermore, in the specification and the respective drawings, the same reference symbols may be applied to elements similar to those that have already been illustrated in another drawing, and a detailed explanation of such elements may be omitted as appropriate.

A display device 2 according to an embodiment of the present disclosure is, for example, an organic electroluminescence display device, and is installed in a television, a personal computer, a mobile terminal, a cellular phone, and the like. FIG. 1 illustrates a schematic view of a configuration of the display device 2 according to the embodiment. The display device 2 is provided with a pixel array part 4 that displays an image, and a driving part that drives the pixel array part 4. The display device 2 is a flexible display, and has a wiring layer that includes a base material made of a resin film having flexibility, and a wiring provided inside or over the base material.

On the pixel array part 4, an organic light emitting diode 6 and a pixel circuit 8 are arranged in a matrix form in correspondence with a pixel. The pixel circuit 8 includes a lighting TFT (thin film transistor) 10, a driving TFT 12, a capacitor 14, and the like.

Whereas, the driving part includes a scan line driving circuit 20, an image line driving circuit 22, a driving electric power supply circuit 24, and a control device 26, and drives the pixel circuit 8 to control light emission of the organic light emitting diode 6.

The scan line driving circuit 20 is connected to a scan signal line 28 provided for each horizontal line of pixels (pixel row). The scan line driving circuit 20 selects scan signal lines 28 in order according to timing signals input from the control device 26, and applies an electric voltage for turning on the lighting TFT 10 to the selected scan signal line 28.

The image line driving circuit 22 is connected to an image signal line 30 provided for each vertical line of pixels (pixel column). The image line driving circuit 22 receives an input of an image signal from the control device 26, and in accordance with a selection of the scan signal line 28 by the scan line driving circuit 20, outputs an electric voltage according to the image signal for the selected pixel row to each image signal line 30. That electric voltage is written into the capacitor 14 via the lighting TFT 10 in the selected pixel row. The driving TFT 12 supplies the organic light emitting diode 6 with an electric current according to the written electric voltage, and thus the organic light emitting diode 6 of the pixel that corresponds to the selected scan signal line 28 emits light.

The driving electric power supply circuit 24 is connected to a driving electric power supply line 32 provided for each pixel column, and supplies the organic light emitting diode 6 with an electric current via the driving electric power supply line 32 and the driving TFT 12 in the selected pixel row.

Here, a lower electrode of the organic light emitting diode 6 is connected to the driving TFT 12. Whereas, an upper electrode of each organic light emitting diode 6 is composed of an electrode shared in common by the organic light emitting diodes 6 of all the pixels. In a case where the lower electrode is configured as an anode, a high electric potential is input thereto, and the upper electrode becomes a cathode and a low electric potential is input thereto. In a case where the lower electrode is configured as a cathode, a low electric potential is input thereto, and the upper electrode becomes an anode and a high electric potential is input thereto.

Figure 2:
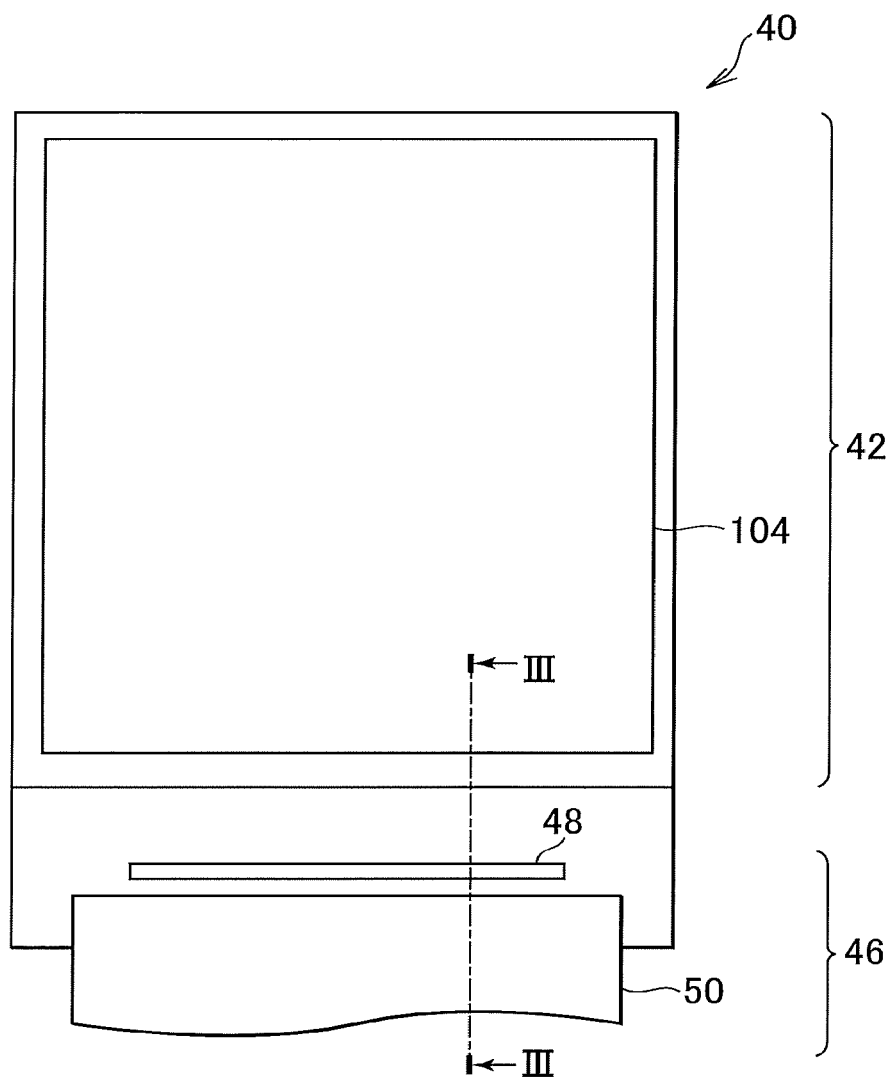
FIG. 2 illustrates a schematic planar view of a display panel on the display device according to the present invention.

FIG. 2 illustrates a schematic planar view of the display panel 40 of the display device 2. The pixel array part 4 illustrated in FIG. 1 is provided in a display area 42 of the display panel 40, and as described above the organic light emitting diode 6 is arranged on the pixel array part 4. As described above, an upper electrode 104 that constitutes the organic light emitting diode 6 is formed so as to be shared in common by the respective pixels and covers the entire display area 42.

On one side of the display panel 40 that has a rectangular shape, a driving part formation area 46 is provided, and a wiring connected to the display area 42 is disposed thereon. Further, on the driving part formation area 46 a driver IC 48 that constitutes the driving part is mounted, and an FPC (Flexible Printed Circuits) 50 is connected to the driving part formation area 46. The FPC 50 is connected to the scan line driving circuit 20, the image line driving circuit 22, the driving electric power supply circuit 24, the control device 26, and the like, and an IC is mounted on the FPC 50.

Figure 3:
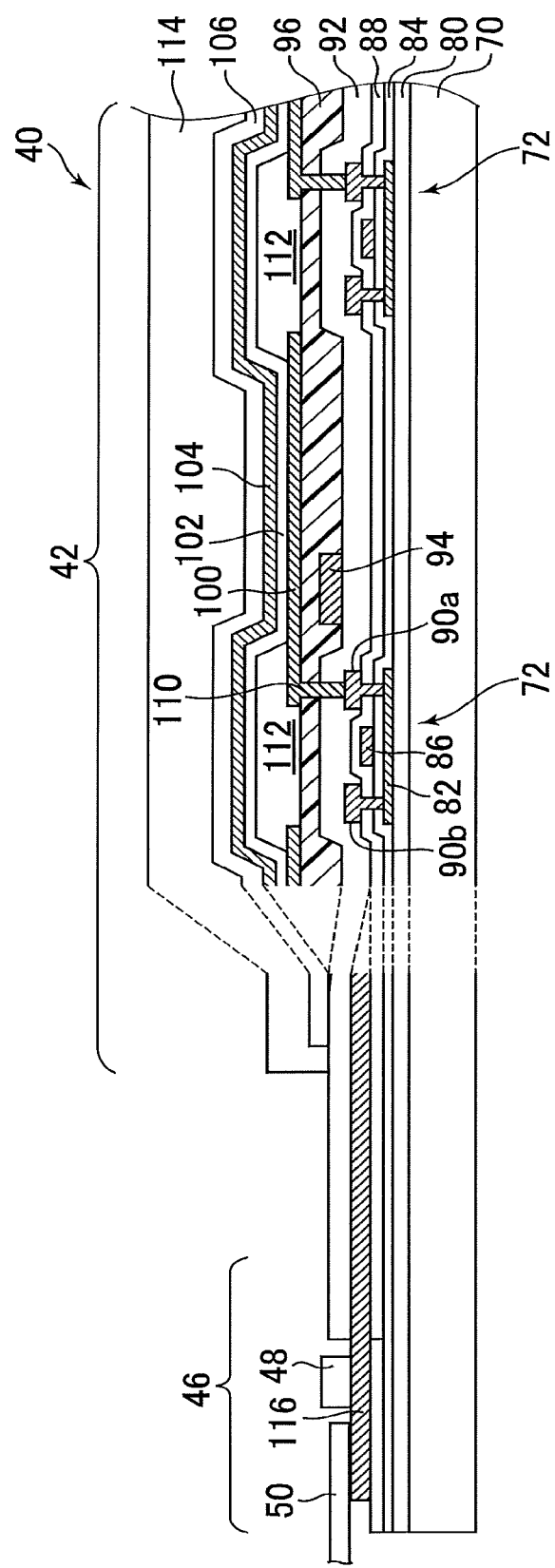
FIG. 3 illustrates a schematic vertical cross sectional view as to a cross section of the display panel along III-III line in FIG. 2.

FIG. 3 illustrates a schematic vertical cross sectional view as to a cross section of the display panel 40 along III-III line illustrated in FIG. 2. The display panel 40 has a structure where a circuit layer composed of a TFT 72 and the like, the organic light emitting diode 6, a sealing layer 106 that seals the organic light emitting diode 6, and the like are laminated on an insulating base material 70 constituted by a resin film. As the insulating base material 70, a polyimide film can be used, for example. A protecting film 114 can be formed on the sealing layer 106. In the present embodiment, the pixel array part 4 is a top emission type pixel array, and light generated in the organic light emitting diode 6 is emitted to the side opposite from the insulating base material 70, that is, the light is emitted in an upper direction in FIG. 3. Note that in a case where the colorization method of the display device 2 is the color filter method, a color filter is disposed between the sealing layer 106 and the protecting film 114, or is disposed on the opposing substrate side and by generating white light in the organic light emitting diode 6 and transmitting that white light through the color filter, lights in colors such as red (R), green (G), and blue (B) are generated.

On the circuit layer of the display area 42, the pixel circuit 8, the scan signal line 28, the image signal line 30, and the driving electric power supply line 32 that have been described above, and the like are formed. Further, at least a part of the driving part can be formed as a circuit layer in an area adjacent to the display area 42, on the insulating base material 70. Moreover, as described above, the driver IC 48 and the FPC 50 that constitute the driving part can be connected to a wiring 116 of the circuit layer in the driving part formation area 46.

Specifically, on the insulating base material 70, a polysilicon resin (p-Si) film is formed with an interposition of an under layer 80 made of an inorganic insulating material such as silicon nitride resin (SiNy) and silicon oxide resin (SiOx), that p-Si film is subjected to patterning so that the p-Si film is selectively left at a position where the p-Si film is necessary in the circuit layer. For example, using the p-Si film, a semiconductor area 82 is formed which is to become the channel part and the source/drain part of the top gate type TFT 72. On the channel part of the TFT 72, a gate electrode 86 is disposed with an interposition of a gate insulating film 84. The gate electrode 86 is formed by patterning a metal film formed by sputtering or the like. After that, an interlayer insulating film 88 is laminated which covers the gate electrode 86. Into the p-Si to be the source part and the drain part of the TFT 72, impurities are introduced by an ion injection, and further a source electrode 90a and a drain electrode 90b are formed which are electrically connected to the p-Si to be the source part and the drain part of the TFT 72. After forming the TFT 72 in this manner, an interlayer insulating film 92 is laminated. On the surface of the interlayer insulating film 92, a wiring 94 and the like can be formed by patterning the metal film formed by the sputtering or the like, and with that metal film and the metal film used for the formation of the gate electrode 86, the source electrode 90a, and the drain electrode 90b, the wiring 116, and the scan signal line 28, the image signal line 30, and the driving electric power supply line 32 illustrated in FIG. 1 can be formed as a multilayered wiring structure, for example. On the multilayered wiring structure, a planarizing film 96 is formed by laminating an organic material such as acrylic resin, for example, to thereby form the organic light emitting diode 6 on the surface of the planarized display area 42.

The organic light emitting diode 6 is constituted by a lower electrode 100, an organic material layer 102, and an upper electrode 104. The lower electrode 100, the organic material layer 102, and the upper electrode 104 as above are laminated in order starting from the insulating base material 70 side. In the present embodiment, the lower electrode 100 is an anode of the organic light emitting diode 6, and the upper electrode 104 is a cathode. The organic material layer 102 is configured to include a hole transport layer, a light emitting layer, an electron transport layer, and the like.

If the TFT 72 illustrated in FIG. 3 is the driving TFT 12, which has an n-channel, the lower electrode 100 is connected to the source electrode 90a of the TFT 72. Specifically, after the formation of the planarizing film 96 as described above, a contact hole 110 for connecting the lower electrode 100 to the TFT 72 is formed, the conductive film formed on the surface of the planarizing film 96 and inside the contact hole 110 is subjected to patterning, to thereby form the lower electrode 100 connected to the TFT 72 in each pixel.

After the formation of the lower electrode 100, a bank 112 is formed at a border between the pixels. In an effective area of the pixel surrounded by the bank 112, the lower electrode 100 is not covered. After the formation of the bank 112, the respective layers which constitute the organic material layer 102 are laminated on the lower electrode 100 in order. On the organic material layer 102, the upper electrode 104 is formed of a transparent electrode material.

On the surface of the upper electrode 104, as the sealing layer 106, for example, a SiNy film is formed by the CVD method. Further, in order to secure mechanical resistance of the surface of the display panel 40, the protective film 114 is laminated on the surface of the display area 42. Meanwhile, the protective film 114 is not provided on the driving part formation area 46 in order to have an easy connection to the IC and to the FPC. The wiring of the FPC 50 and the terminal of the driver IC 48 are electrically connected, for example, to the wiring 116.

In the above, with reference to FIG. 3, the structure of the display panel 40 where the display function layers including the organic light emitting diode 6 which is a display element and circuit layers such as the TFT 72 are formed on one of the principal surfaces of the film like insulating base material 70 having flexibility has been explained.

Figure 4:
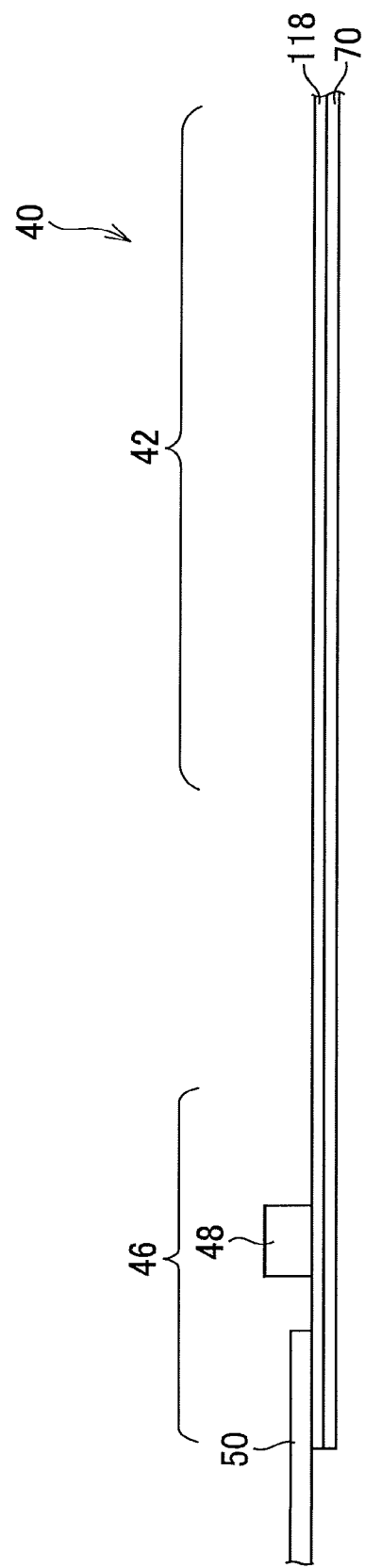
FIG. 4 illustrates a schematic vertical cross sectional view of the display panel on the display device according to the present invention.
Figure 5:
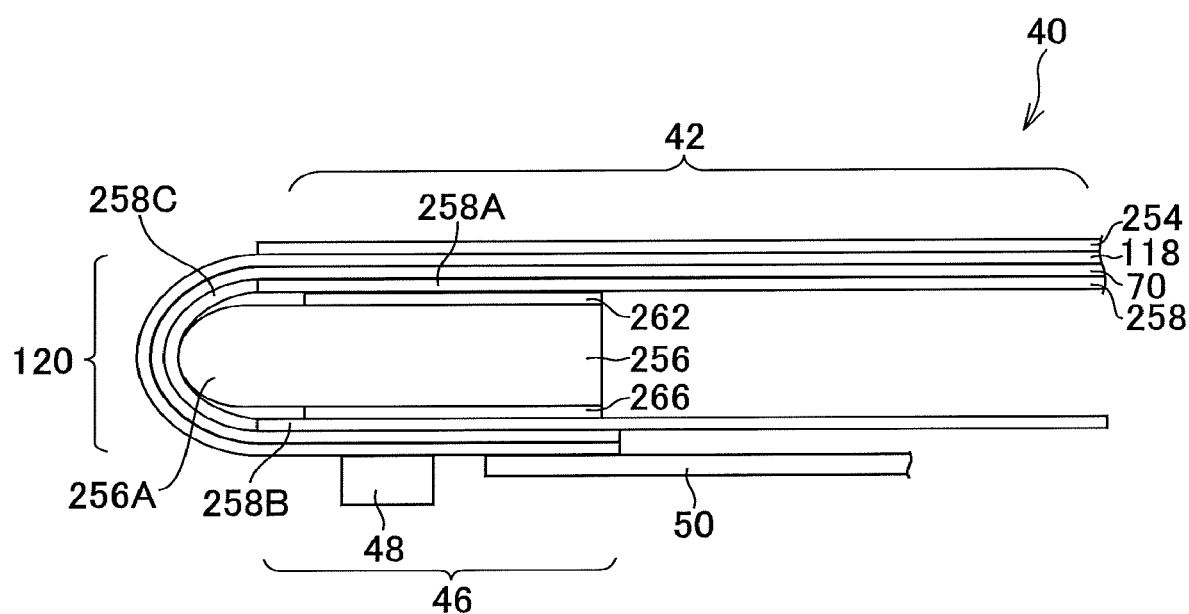
FIG. 5 illustrates a schematic vertical cross sectional view of a display panel that has a bent portion according to the present invention.

As illustrated in FIG. 3, the display panel 40 is manufactured, with the whole of the insulating base material 70 maintained planar. However, when the display panel 40 is put in the housing of the display device 2, one can provide a bent area 120 outside the display area 42 of the display panel 40, and fold the driving part formation area 46 back to the backside of the display area 42. FIGS. 4 and 5 illustrate schematic vertical cross sectional views of the display panel 40 which depict the formation of this bent area 120, and illustrate cross sections along III-III line illustrated in FIG. 2. In FIGS. 4 and 5, the structure of FIG. 3 is illustrated in a simplified style as a two-layered structure composed of the insulating base material 70 and an upper structure layer 118, by illustrating, as the upper structure layer 118, the lamination structure such as the display function layers on the insulating base material 70 out of the lamination structure of the display panel 40 illustrated in FIG. 3. FIG. 4 illustrates the cross section in a state where the display panel 40 is maintained planar, and FIG. 5 illustrates the cross section in a state where the bent area 120 is provided between the driving part formation area 46 to which the FPC 50 and the driver IC 48 are attached and the display area 42, and the FPC 50 and the like are folded back to the backside of the display area 42.

As described above, the display area 42 has the pixel array part 4, and the driving part formation area 46 has the driving part to drive this pixel array part 4. Further, on the bent area 120 that connects the display area 42 and the driving part formation area 46, a first wiring 116A that electrically connects the pixel array part 4 and the driving part is disposed inside the upper structure layer 118. The vector direction of the bending stress which occurs when forming the bent area 120 and the extending direction of the first wiring 116A are approximately the same with each other, and therefore the bending stress applied to a unit length is maximized. Thus, it is necessary to improve bending resistance of the first wiring 116A.

As illustrated in FIG. 5, the display panel 40 has a spacer 256, a front reinforcing film 254, and a back reinforcing film 258, the FPC 50, and the driver IC 48, in addition to the insulating base material 70 and the upper structure layer 118. The front reinforcing film 254 and the back reinforcing film 258 are provided for the purpose of protecting and reinforcing the insulating base material 70 and the upper structure layer 118. The spacer 256 is provided to guide the bending of the insulating base material 70 and the upper structure layer 118.

On the display panel 40, the display area 42 to display an image, the bent area 120, and the driving part formation area 46 are arranged side by side in this order. The bent area 120 has a bent form so as to comply with the form of a guide part 256A of the spacer 256. The driving part formation area 46 is arranged on the backside of the spacer 256 because of the bending of the bent area 120.

As illustrated in FIG. 5, the front reinforcing film 254 is provided on the display surface side of the display area 42 of the display panel 40 so that the front reinforcing film 254 does not overlap the bent area 120.

As illustrated in FIG. 5, the back reinforcing film 258 has a first reinforcing part 258A that is provided between the insulating base material 70 in the display area 42 and the spacer 256 and is attached to the insulating base material 70, a second reinforcing part 258B that is provided between the insulating base material 70 in the driving part formation area 46 and the spacer 256 and is attached to the insulating base material 70, and a bending reinforcing part 258C that is provided between the insulating base material 70 in the bent area 120 and the spacer 256 and is attached to the insulating base material 70.

Further, as illustrated in FIG. 5, the second reinforcing part 258B of the back reinforcing film 258 is attached to the surface of the back side of the spacer 256 by an adhesive member 266, and the first reinforcing part 258A of the back reinforcing film 258 is attached to the surface of the display surface side of the spacer 256 by an adhesive member 262. Note that the adhesive member 262 and the adhesive member 266 may be composed of resin or the like which has adhesiveness and may also be composed of a double sided adhesive tape or the like. Although in the example illustrated in FIG. 5, the bending reinforcing part 258C is not attached to the spacer 256 by an adhesive member, an adhesive member may be provided on the guide part 256A of the spacer 256. Further, for example, as an adhesive member, adhesive resin may be filled in the space between the bending reinforcing part 258C and the spacer 256 to attach the bending reinforcing part 258C to the guide part 256A of the spacer 256 to each other directly.

The spacer 256 has, as illustrated in FIG. 5, in a cross sectional view, the guide part 256A that guides the bend of the bent area 120 of the display panel 40 has a rounded shape. With such a shape, a severance and a breakage of the wiring 116 and the like hardly occur in the bent area 120 of the display panel 40.

In the present embodiment, since the configuration to arrange the back reinforcing film 258 on the inner surface side of the bend of the bent area 120 is adopted, the stress that occurs in the display panel 40 can be alleviated, and a breakage or the like of the wiring 116 of the display panel 40 can be suppressed. Further, the stress occurs at the bent area more easily than at the other areas, but as the bending reinforcing part 258C is provided on the bent area 120, the stress can be alleviated more easily.

FIG. 12 illustrates a schematic view of various types of wirings formed in the bent area 120. As illustrated on FIG. 12, on the bent area 120, a plurality of driving electric power supply lines 32 connected to the driving electric power supply circuit 24, a panel electric power supply line 33 to supply the display panel 40 with an electric power, a plurality of scan line driving circuit signal lines 34 connected to the scan line driving circuit 20, a plurality of image signal lines 30 connected to the image line driving circuit 22, and the like are disposed. Further, between the driving electric power supply lines 32 and the panel electric power supply line 33, and between the panel electric power supply line 33 and the scan line driving circuit signal lines 34, a dummy wiring 130 is disposed. A single panel electric power supply line 33 and the respective driving electric power supply lines 32 are formed to have a plurality of zig zag shaped parts that will be explained later. There may be more than one panel electric power supply lines 33, and those lines 33 may be for either of the anode electric power supply and the cathode electric power supply. The dummy wiring 130 is disposed between different kinds of wirings, in particular, between an electric power supply line and a signal line. The dummy wiring 130 plays a role to suppress an occurrence of noise, and a fixed electric potential may be applied to the dummy wiring 130. In the example illustrated in FIG. 12, the interval between the dummy wirings 130 and another kind of wirings are wider than the interval between neighboring two wirings out of the other kind of wirings. However, the various kinds of wirings, which have the zig zag shape, including the dummy wirings 130, may be disposed with the same interval.

Figure 9:
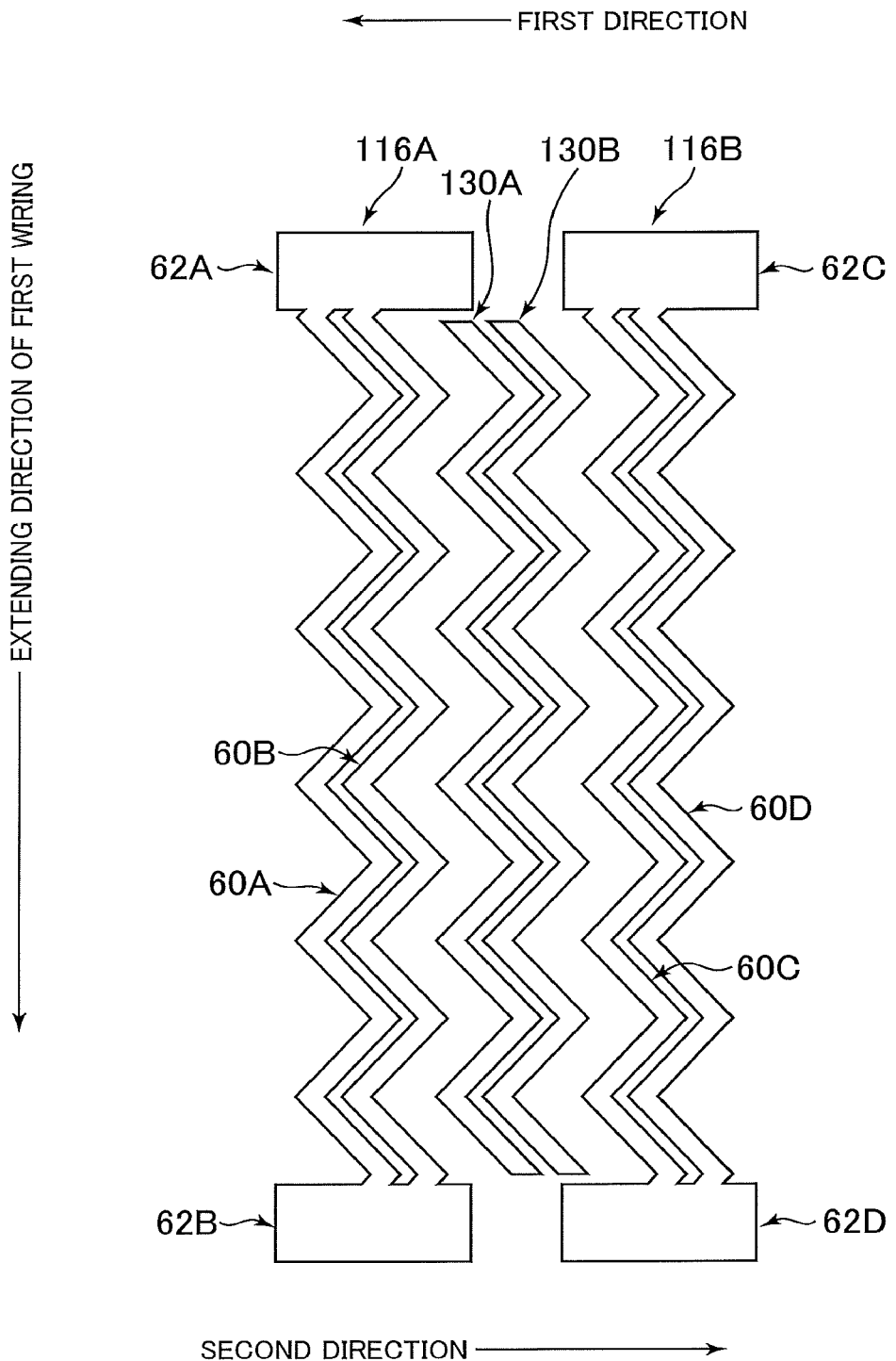
FIG. 9 illustrates a schematic planar view of the first wiring, a second wiring, and a dummy wiring according to the present invention.

Below, some of the wirings out of the various kinds of wirings illustrated in this FIG. 9 are assumed to be the first wring 116A and the second wiring 116B, and the structures thereof are explained in detail.

Figure 6:
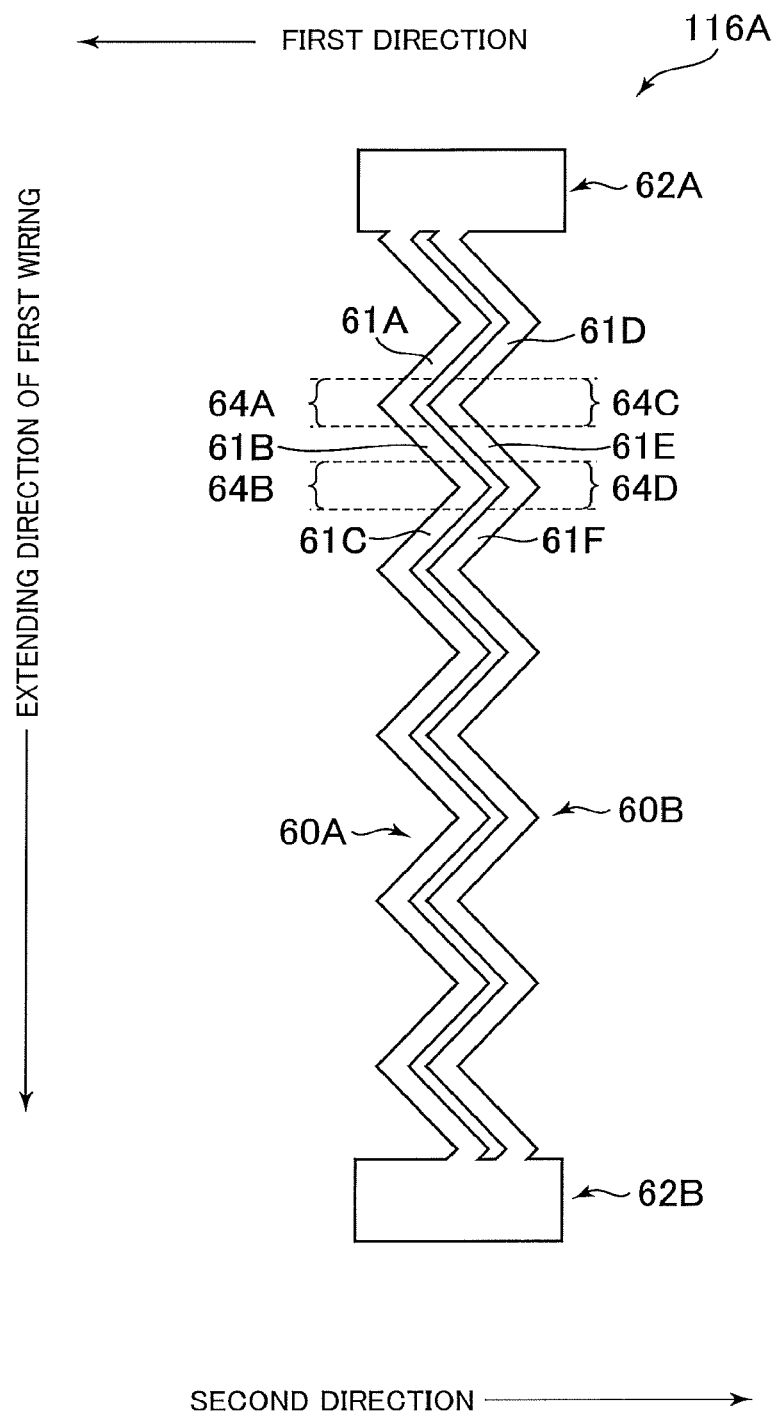
FIG. 6 illustrates a schematic planar view of a first wiring according to the present invention.

FIG. 6 illustrates a planar view of the schematic structure of this first wiring 116A. As illustrated in FIG. 6, the first wiring 116A has a first bent wiring 60A and a second bent wiring 60B, and the two ends of each of the wirings 60A and 60B are integrated into one by a first connection end 62A to be electrically connected to the pixel array part 4 and a second connection end 62B to be electrically connected to the driving part.

The first bent wiring 60A has a first bent portion 64A bent to a first direction side (the first direction is a direction substantially orthogonal to the extending direction of the first wiring 116A) and a second bent portion 64B bent to a second direction side (the second direction is a direction substantially opposite to the first direction). The second bent wiring 60B is disposed on the second direction side when viewed from the first bent wiring 60A. The second bent wiring 60B has a third bent portion 64C bent to the first direction side and a fourth bent portion 64D bent to the second direction side.

The first bent wiring 60A has a first extending portion 61A that extends in a direction having a direction component of the extending direction of the first wiring 116A and a direction component of the first direction. The first bent wiring 60A changes its extending direction at the first bent portion 64A, and has a second extending portion 61B that extends in a direction having a direction component of the extending direction of the first wiring 116A and a direction component of the second direction. The first bent wiring 60A changes its extending direction at the second bent portion 64B, and has a third extending portion 61C that extends in a direction having a direction component of the extending direction of the first wiring 116A and a direction component of the first direction. Like this, the first bent wiring 60A has a zig zag shape.

The second bent wiring 60B has a fourth extending portion 61D that extends in a direction having a direction component of the extending direction of the first wiring 116A and a direction component of the first direction. The second bent wiring 60B changes its extending direction at the third bent portion 64C, and has a fifth extending portion 61E that extends in a direction having a direction component of the extending direction of the first wiring 116A and a direction component of the second direction. The second bent wiring 60B changes its extending direction at the fourth bent portion 64D, and has a sixth extending portion 61F that extends in a direction having a direction component of the extending direction of the first wiring 116A and a direction component of the first direction. Like this, the second bent wiring 60B has a zig zag shape.

As seen above, the first wiring 116A is configured to have the first bent wiring 60A and the second bent wiring 60B that have a plurality of bent portions, and therefore the configuration for improving the bending resistance can be realized. That is, the first bent wiring 60A and the second bent wiring 60B that have the plurality of bent portions have straight line areas provided between the plurality of bent portions, and the extending directions of these straight line areas are inclined with respect to the vector direction of the bending stress that occurs when forming the bent area 120. Accordingly, the bending stress applied to a unit length can be reduced according to the inclination angle, and as a result thereof, the bending resistance of the first wiring 116A can be improved.

Figure 7:
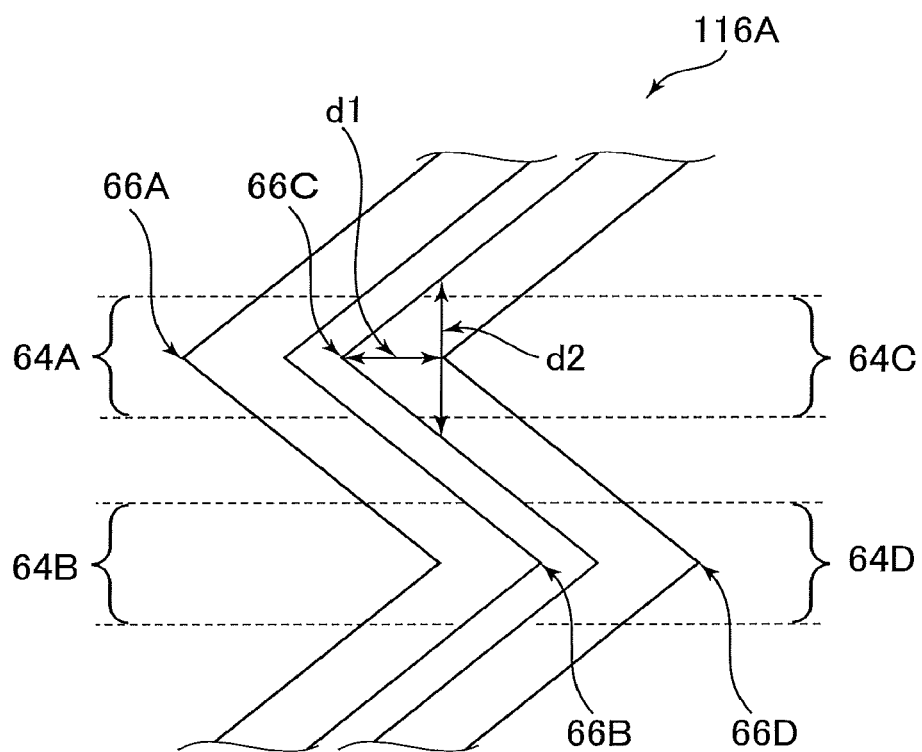
FIG. 7 illustrates a partial enlarged view of FIG. 6.

Further, as illustrated in FIG. 7 as a partial enlarged view of FIG. 6, a third bending point 66C that the third bent portion 64C has is positioned on the first direction side when viewed from a second bending point 66B that the second bent portion 64B has. In other words, the second bending point 66B that the second bent portion 64B has is positioned on the second direction side when viewed from the third bending point 66C that the third bent portion 64C has.

Due to such a configuration, it becomes possible to dispose the first bent wiring 60A and the second bent wiring 60B close to each other, and a ratio of a conductive body formation area with respect to a unit area can be increased. As a result thereof, reduction of the electric resistance of the first wiring 116A can be realized. Therefore, due to the above configuration, the reduction of the electric resistance of the first wiring 116A and an improvement of the bending resistance in the bent area 120 can go together.

Note that the bending angles of the first bent portion 64A, the second bent portion 64B, the third bent portion 64C, and the fourth bent portion 64D are preferably acute angles. By setting the bending angles to be acute angles, the extending directions of the straight line areas disposed between the respective bent portions are more deeply inclined with respect to the vector direction of the bending stress that occurs when forming the bent area 120, and accordingly the bending stress applied to a unit length can be reduced. As a result, the bending resistance of the first wiring 116A can be further improved.

Further, it is preferable that a longest width d2 of the first wiring 116A measured at each bent portion along the extending direction of the first wiring 116A is set to be less than twice a width d1 of the first wiring 116A measured at the first bending point 66A, the second bending point 66B, the third bending point 66C, and the fourth bending point 66D along a direction orthogonal to the extending direction of the first wiring 116A. Here, the width of the first wiring 116A measured at each bent portion along the extending direction of the first wiring 116A takes the largest value at the inner periphery side of each bent portion, generally. As such, the longest width d2 of the first wiring 116A measured at each bent portion along the extending direction of the first wiring 116A is equivalent to a width of the first wiring 116A measured at the inner periphery side of each bent portion along the extending direction of the first wiring 116A. If the bending angle is a right angle, a triangle constituted by the width d2 and the bending point becomes a rectangular equilateral triangle, the width d2 becomes the length of the bottom side of that rectangular equilateral triangle, and the width d1 becomes the height of the rectangular equilateral triangle. Therefore, the width d2 is twice the width d1. Accordingly, with the configuration where the bending angles of the first bent portion 64A, the second bent portion 64B, the third bent portion 64C, and the fourth bent portion 64D are acute angles, and the longest width d2 of the first wiring 116A measured at each bent portion along the extending direction of the first wiring 116A is less than twice the width d1 of the first wiring 116A measured along the direction orthogonal to the extending direction of the first wiring 116A at the first bending point 66A, the second bending point 66B, the third bending point 66C, and the fourth bending point 66D, the bending resistance can be further improved, which is preferable.

Further, by setting the bending angles of the first bent portion 64A, the second bent portion 64B, the third bent portion 64C, and the fourth bent portion 64D to be acute angles, the density of the wiring formation area measured along the extending direction of the first wiring 116A can be increased, and the ratio of the conductive body formation area with respect to a unit area can be further increased, which can contribute to a further reduction of the electric resistance of the first wiring 116A.

Figure 8:
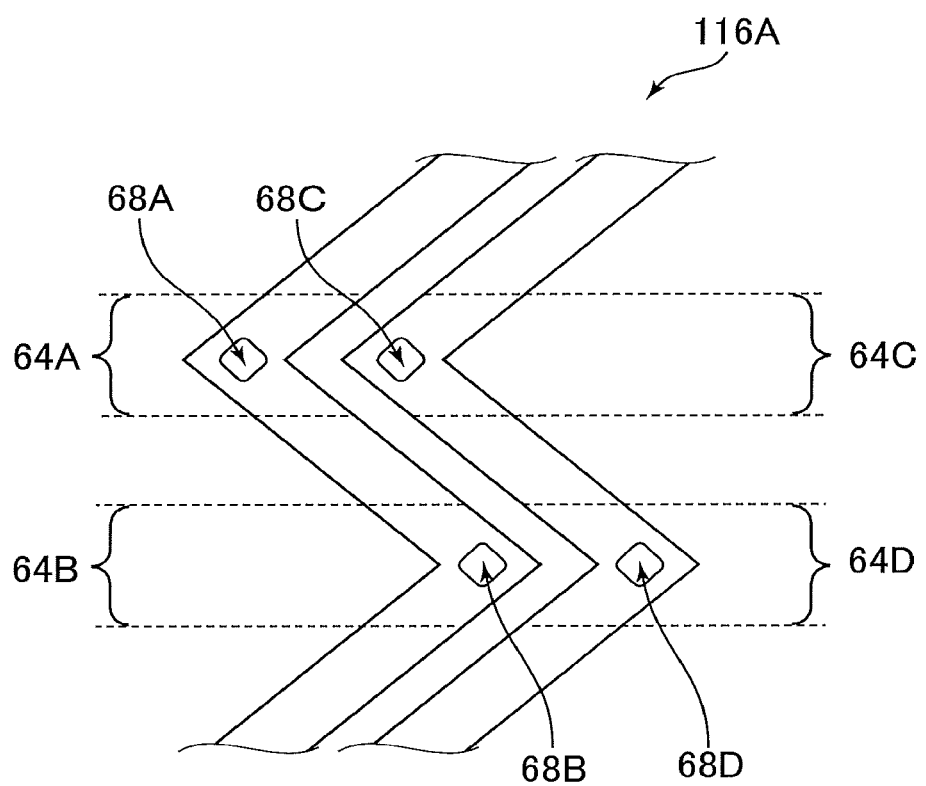
FIG. 8 illustrates a schematic planar view of another example of the first wiring according to the present invention.

Further, as illustrated in FIG. 8, by providing a first opening 68A, a second opening 68B, a third opening 68C, and a fourth opening 68D in the first bent portion 64A, the second bent portion 64B, the third bent portion 64C, and the fourth bent portion 64D respectively, it is configured that the conductive body that constitutes each bent portion becomes thinner. According to such a configuration, flexibility of each bent portion can be improved, and as a result thereof, kink resistance of the first wiring 116A formation plane can be improved.

FIG. 9 illustrates a planar view of the configuration to arrange the second wiring 116B on the second direction side when viewed from the first wiring 116A. The second wiring 116B has a third bent wiring 60C and a fourth bent wiring 60D, and the two ends of each of the wirings 60C and 60D are integrated into one by a third connection end 62C to be electrically connected to the pixel array part 4 and a fourth connection end 62D to be electrically connected to the driving part. Further, between the first wiring 116A and the second wiring 116B, a first dummy wiring 130A and a second dummy wiring 130B are arranged.

In a case where the second wiring 116B which has an electric potential different from an electric potential of the first wiring 116A is disposed alongside the first wiring 116A, by providing the first dummy wiring 130A and the second dummy wiring 130B between the first wiring 116A and the second wiring 116B, a shield effect between the first wiring 116A and the second wiring 116B whose electric potentials are different from each other can be obtained, which is preferable.

As for the present embodiment, the explanation has been given with respect to the configuration where the first dummy wiring 130A and the second dummy wiring 130B are arranged between the first wiring 116A and the second wiring 116B. However, the shield effect mentioned above can be obtained also in the configuration where only the first dummy wiring 130A is arranged between the first wiring 116A and the second wiring 116B.

Figure 10:
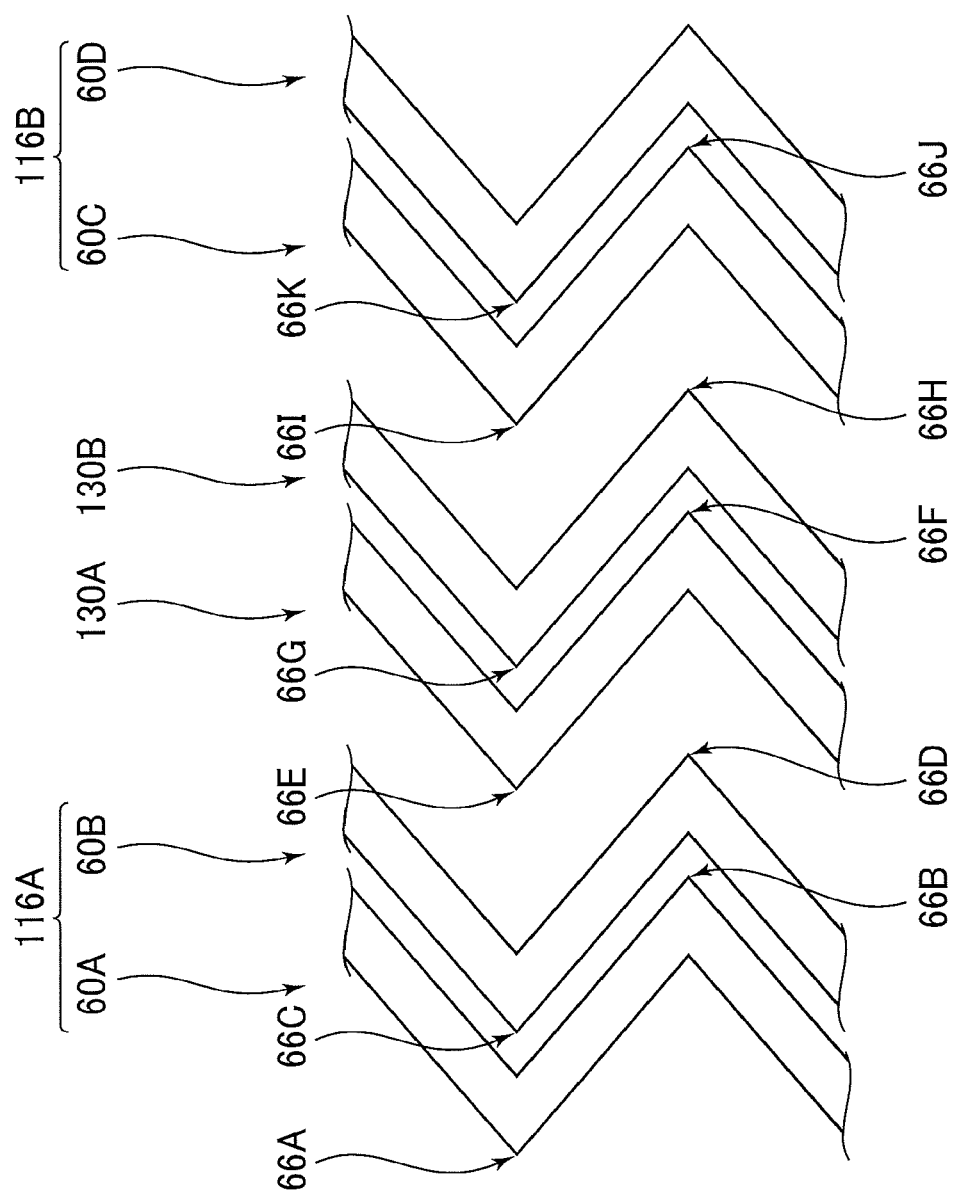
FIG. 10 illustrates a partial enlarged view of FIG. 9.

As illustrated in FIG. 10 as a partial enlarged view of FIG. 9, the first dummy wiring 130A includes a fifth bending point 66E which the bent portion being bent to the first direction side has, and a sixth bending point 66F that the bent portion being bent to the second direction side has. Further, the fifth bending point 66E is positioned on the first direction side when viewed from the fourth bending point 66D which the second bent wiring 60B has. In other words, the fourth bending point 66D is positioned on the second direction side when viewed from the fifth bending point 66E.

Likewise, the sixth bending point 66F of the bent portion of the first dummy wiring 130A where the first dummy wiring 130A is bent to the second direction side is positioned on the second direction side when viewed from a seventh bending point 66G of the bent portion of the second dummy wiring 130B where the second dummy wiring 130B is bent to the first wiring side.

Further, an eighth bending point 66H of the bent portion of the second dummy wiring 130B where the second dummy wiring 130B is bent to the second direction side is positioned on the second direction side when viewed from a ninth bending point 66I of the bent portion of the third bent wiring 60C included in the second wiring 116B where the third bent wiring 60C is bent to the first direction side.

Further, a tenth bending point 66J of the bent portion of the third bent wiring 60C where the third bent wiring 60C is bent to the second direction side is positioned on the second direction side when viewed from an eleventh bending point 66K of the bent portion of the fourth bending wiring 60D where the fourth bending wiring 60D is bent to the first direction side.

Due to such a configuration, the first wiring 116A, the first dummy wiring 130A, the second dummy wiring 130B, and the second wiring 116B can be disposed close to one another, and the ratio of the conductive body formation area with respect to a unit area can be increased, and as a result thereof the low electric resistance of the first wiring 116A can be realized.

Figure 11:
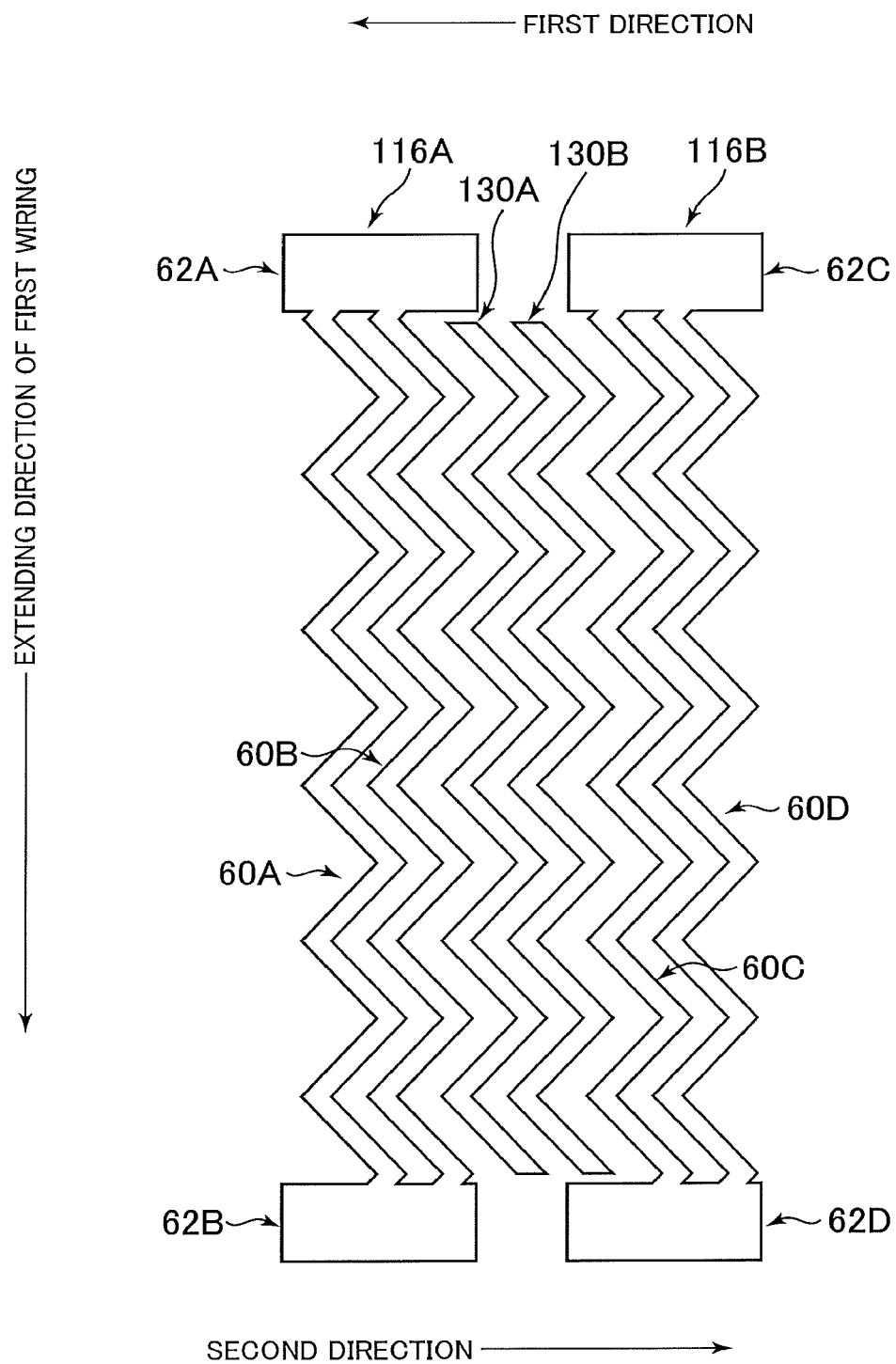
FIG. 11 illustrates a schematic planar view of another example of the first wiring, the second wiring, and the dummy wiring according to the present invention.

In a case where as illustrated in FIG. 11, the space between the first bent wiring 60A and the second bent wiring 60B, the space between the second bent wiring 60B and the first dummy wiring 130A, the space between the first dummy wiring 130A and the second dummy wiring 130B, the space between the second dummy wiring 130B and the third bent wiring 60C, and the space between the third bent wiring 60C and the fourth bent wiring 60D are configured to be equal to one another, it becomes possible to manufacture the display panel without particularly adjusting the sizes of the respective spaces. Such a configuration gives advantages with respect to the manufacturing and is thus preferable.

While the invention has been described with respect to a limited number of embodiments, those skilled in the art, having benefit of this disclosure, will appreciate that other embodiments can be advised which do not depart from the scope of the invention as described therein. Accordingly, the scope of the invention should be limited only by the claims.

What is claimed is:

1. A display device comprising:
a display area which has a pixel array part;
a driving part formation area which is provided on a backside of the display area and has a driving part to drive the pixel array part; and
a bent area which connects the display area and the driving part formation area, and has a first wiring to electrically connect the pixel array part and the driving part, wherein
the first wiring has a first bent wiring and a second bent wiring, and
the first bent wiring comprises:
a first extending portion which extends in a direction having a direction component of an extending direction of the first wiring and a direction component of a first direction roughly orthogonal to the extending direction of the first wiring;
a second extending portion which extends in a direction having a direction component of the extending direction of the first wiring and a direction component of a second direction roughly opposite to the first direction;
a third extending portion which extends in a direction having a direction component of the extending direction of the first wiring and a direction component of the first direction;
a first bent portion which is positioned between the first extending portion and the second extending portion and is bent to a side of the first direction; and
a second bent portion which is positioned between the second extending portion and the third extending portion and is bent to a side of the second direction, and wherein the second bent wiring is positioned on the side of the second direction when viewed from the first wiring, and comprises:
a fourth extending portion which extends in a direction having a direction component of the extending direction of the first wiring and a direction component of the first direction;
a fifth extending portion which extends in a direction having a direction component of the extending direction of the first wiring and a direction component of the second direction;
a sixth extending portion which extends in a direction having a direction component of the extending direction of the first wiring and a direction component of the first direction;
a third bent portion which is positioned between the fourth extending portion and the fifth extending portion and is bent to the side of the first direction; and
a fourth bent portion which is positioned between the fifth extending portion and the sixth extending portion and is bent to the side of the second direction, and wherein
a bending point of the third bent portion is positioned on the side of the first direction when viewed from a bending point of the second bent portion,
wherein the display device further comprises:
a second wiring which electrically connects the pixel array part and the driving part, and has an electric potential different from an electric potential of the first wiring; and
a dummy wiring which is disposed between the first wiring and the second wiring, and is not electrically connected to the pixel array part and the driving part, and
wherein the dummy wiring is arranged between the first wiring and the second wiring in the bent area.

2. The display device according to claim 1, wherein a bending angle of at least one of the first to fourth bent portions is an acute angle.

3. The display device according to claim 1, wherein a longest width of the first wiring measured at at least one of the first to fourth bent portions along the extending direction of the first wiring is less than twice the width of the first wiring measured at the bending point along a direction orthogonal to the extending direction of the first wiring.

4. The display device according to claim 1, wherein at least one of the first to fourth bent portions has an opening.

5. The display device according to claim 1, wherein the dummy wiring has a fifth bent portion that is bent to the side of the first direction and has a bending point positioned on the side of the first direction when viewed from a bending point of the fourth bent portion, and a sixth bent portion that is bent to the side of the second direction.

6. The display device according to claim 1, wherein a space between the first bent wiring and the second bent wiring is equivalent to a space between the second bent wiring and the dummy wiring.

7. A display device comprising:
a display area which has a pixel array part;
a driving part formation area which is provided on a backside of the display area and has a driving part to drive the pixel array part; and
a bent area which connects the display area and the driving part formation area, and includes a plurality of first connection lines to electrically connect the pixel array part and the driving part, a dummy wiring being not electrically connected to the pixel array part and the driving part, and a second connection line to electrically connect the pixel array part and the driving part, wherein each of the first connection lines includes a first wiring and a second wiring, the first wiring being disposed obliquely and rightward to an extending direction of the plurality of the first connection lines and the second connection line, the second wiring being disposed obliquely and leftward to the extending direction and connected to the first wiring, the second connection line includes a third wiring and a fourth wiring, the third wiring being disposed obliquely and rightward to the extending direction, the fourth wiring being disposed obliquely and leftward to the extending direction, and the dummy wiring is arranged between the first connection lines and the second connection line in the bent area.

8. The display device according to claim 7, wherein each of the first connection lines includes a first connection metal and a second connection metal, a first width of the first connection metal being wider than a second width of the first wiring, the first width being wider than a third width of the second wiring, a fourth width of the second connection metal being wider than the second width, and the fourth width being wider than the third width, one edge of the first wiring connected to the first connection metal, another edge of the first wiring connected to one edge of the second wiring, and another edge of the second wiring connected to the second connection metal, the second connection line includes a plurality of the third wirings and a plurality of the fourth wirings, the second connection line includes a third connection metal and a fourth connection metal, a fifth width of the third connection metal being wider than a sixth width of each of the third wirings, the fifth width being wider than a seventh width of each of the fourth wirings, an eighth width of the fourth connection metal being wider than the sixth width, and the eighth width being wider than the seventh width, all of one edges of the third wirings connected to the third connection metal, each of other edges of the third wirings connected to a corresponding one edge of each of the fourth wirings, and all of other edges of the fourth wirings connected to the fourth connection metal.

9. The display device according to claim 8, wherein the dummy wiring does not exist between the first connection metal and the third connection metal in a predetermined direction perpendicular to the extending direction, and the dummy wiring does not exist between the second connection metal and the fourth connection metal in the predetermined direction.

10. The display device according to claim 8, wherein the dummy wiring includes a fifth wiring and a sixth wiring, the fifth wiring being disposed obliquely and rightward to the extending direction, the sixth wiring being disposed obliquely and leftward to the extending direction, the sixth wiring exists between the first connection metal and the third connection metal in a predetermined direction perpendicular to the extending direction.

11. The display device according to claim 8, wherein a space between the first connection line and the dummy wiring is equivalent to a space between the second connection line and the dummy wiring.

12. A display device comprising:
a display area which has a pixel array part;
a driving part formation area which is provided on a backside of the display area and has a driving part to drive the pixel array part; and
a bent area which connects the display area and the driving part formation area, and has a plurality of first connection lines to electrically connect the pixel array part and the driving part, a dummy wiring being not electrically connected to the pixel array part and the driving part, and a second connection line to electrically connect the pixel array part and the driving part, wherein each of the first connection lines, the second connection line, and the dummy wiring extends in a extending direction, each of the first connection lines has a first zigzag arrangement, the second connection line has a second zigzag arrangement, and the dummy wiring has a third zigzag arrangement and is arranged between the first connection lines and the second connection line in the bent area.

13. The display device according to claim 12, wherein each of the first connection lines includes a first connection metal, a second connection metal, and a first zigzag metal, a first width of the first connection metal being wider than a second width of the first zigzag metal, a third width of the second connection metal being wider than the second width, one edge of the first zigzag metal connected to the first connection metal, and another edge of the first zigzag metal connected to the second connection metal, the second connection line includes a third connection metal, a fourth connection metal, and a plurality of second zigzag metals, a fourth width of the third connection metal being wider than a fifth width of each of the second zigzag metals, a sixth width of the fourth connection metal being wider than each of the second zigzag metals, all of one edges of the second zigzag metals connected to the third connection metal, and all of other edges of the second zigzag metals connected to the fourth connection metal.

14. The display device according to claim 13, wherein the dummy wiring does not exist between the first connection metal and the third connection metal in a predetermined direction perpendicular to the extending direction, and the dummy wiring does not exist between the second connection metal and the fourth connection metal in the predetermined direction.

15. The display device according to claim 13, wherein the third zigzag metal has a same width,
a portion of the third zigzag metal having the same width exists between the first connection metal and the third connection metal in a predetermined direction perpendicular to the extending direction.

16. The display device according to claim 13, wherein a space between the first connection line and the dummy wiring is equivalent to a space between the second connection line and the dummy wiring.

* * * * *